(12) United States Patent
Shim

(10) Patent No.: US 7,266,033 B2
(45) Date of Patent: Sep. 4, 2007

(54) SEMICONDUCTOR MEMORY DEVICE

(75) Inventor: Young-Bo Shim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 114 days.

(21) Appl. No.: 11/323,359

(22) Filed: Dec. 29, 2005

(65) Prior Publication Data

US 2007/0002657 A1    Jan. 4, 2007

(30) Foreign Application Priority Data

Jun. 30, 2005    (KR) ........................ 10-2005-0058406

(51) Int. Cl.
*G11C 7/00* (2006.01)
(52) U.S. Cl. ..................... 365/222; 365/201
(58) Field of Classification Search ............... 365/222, 365/201
See application file for complete search history.

(56) References Cited

U.S. PATENT DOCUMENTS

| | | | |
|---|---|---|---|
| 5,349,562 A * | 9/1994 | Tanizaki | 365/222 |
| 5,450,364 A * | 9/1995 | Stephens et al. | 365/222 |
| 5,793,776 A | 8/1998 | Qureshi et al. | |
| 6,246,619 B1 * | 6/2001 | Ematrudo et al. | 365/201 |
| 6,349,066 B1 * | 2/2002 | Nakamura | 365/201 |
| 6,545,925 B2 | 4/2003 | Lee | |
| 6,781,908 B1 | 8/2004 | Pelley et al. | |
| 6,912,169 B2 | 6/2005 | Choi | |

FOREIGN PATENT DOCUMENTS

| | | |
|---|---|---|
| JP | 10-97787 | 4/1998 |
| JP | 2001-195897 | 7/2001 |
| KR | 10-2004-0006768 | 1/2004 |

* cited by examiner

*Primary Examiner*—Anh Phung
(74) *Attorney, Agent, or Firm*—Blakely Sokoloff Taylor & Zafman

(57) ABSTRACT

A semiconductor memory device is provided. The semiconductor memory device includes: an oscillation means for generating a self-refresh enable signal and a self-refresh period pulse having a predetermined period in response to a self-refresh signal; a shift register for generating a self-refresh period level signal maintaining a different level at every self-refresh period defined by the self-refresh enable signal and the self-refresh period pulse, in response to a test mode signal; a multiplexing means for selectively outputting a data signal and the self-refresh period level signal in response to the test mode signal; and an output buffer for buffering the output signal of the multiplexing means to output the buffered signal.

10 Claims, 3 Drawing Sheets

SEMICONDUCTOR MEMORY DEVICE

FIELD OF THE INVENTION

The present invention relates to a design technology for a semiconductor circuitry; and more particularly, to a technology with regard to a self-refresh for measuring a self-refresh period in a semiconductor memory device.

DESCRIPTION OF RELATED ART

In general, data stored at a cell in a dynamic random access memory (DRAM) device are disappeared with the lapse of time unlike a static random access memory (SRAM) or a flash memory. To prevent this, it is performed to write back the stored data at the memory cells periodically, which is called a refresh. When memory arrays are accessed to be refreshed, the data stored in the memory cells are read to sense-amplifiers, and immediately written back to the memory cells. Herein, the retention time means a time that a predetermined data stored in the memory cells can be maintained for after writing the predetermined data at the memory cells.

Meanwhile, there are two different refresh operations depending on the mode of the DRAM operation: one is an auto-refresh mode; and the other is a self-refresh mode. In the auto-refresh mode, an internal address is generated in response to a combination of external command signals periodically in a normal mode, which results in refreshing a corresponding cell. The self-refresh operation, however, is performed using an internal command in a non-normal mode, e.g., in a power-down mode. Both the auto-refresh mode and the self-refresh mode are performed generating a predetermined address from an internal counter after receiving the command, and this predetermined address is sequentially increased as every command is inputted thereto.

Meanwhile, the self-refresh is performed using a periodic signal outputted from a ring oscillator disposed in an interior of the chip. Herein, since the ring oscillator for the self-refresh typically is configured with transistors and resistors, there are large errors of the self-refresh period according to variations of process, voltage and temperature (PVT). Moreover, this has a large effect on self-refresh current in a low power DRAM in particular.

In order to measure the self-refresh period according to the prior art, a short pulse representing the self-refresh period is outputted through an output pin DQ in a test mode.

However, the self-refresh period is a very short period in a range from tens of microseconds to hundreds of microseconds typically so that it is difficult to measure the short pulsed output signal with a tester or an oscilloscope according to the prior art.

SUMMARY OF THE INVENTION

It is, therefore, an object of the present invention to provide a semiconductor memory device capable of easily monitoring a self-refresh period in a test mode.

In accordance with an aspect of the present invention, there is provided a semiconductor memory device including: an oscillator for generating a self-refresh enable signal and a self-refresh period pulse having a predetermined period in response to a self-refresh signal; a shift register for generating a self-refresh period level signal maintaining a different level at every self-refresh period defined by the self-refresh enable signal and the self-refresh period pulse, in response to a test mode signal; a multiplexer for selectively outputting a data signal and the self-refresh period level signal in response to the test mode signal; and an output buffer for buffering the output signal of the multiplexer to output the buffered signal.

BRIEF DESCRIPTION OF THE DRAWINGS

The above and other objects and features of the present invention will become better understood with respect to the following description of the embodiments given in conjunction with the accompanying drawings, in which.

DETAILED DESCRIPTION OF THE INVENTION

A semiconductor memory device in accordance with exemplary embodiments of the present invention will be described in detail with reference to the accompanying drawings.

Figure 1:
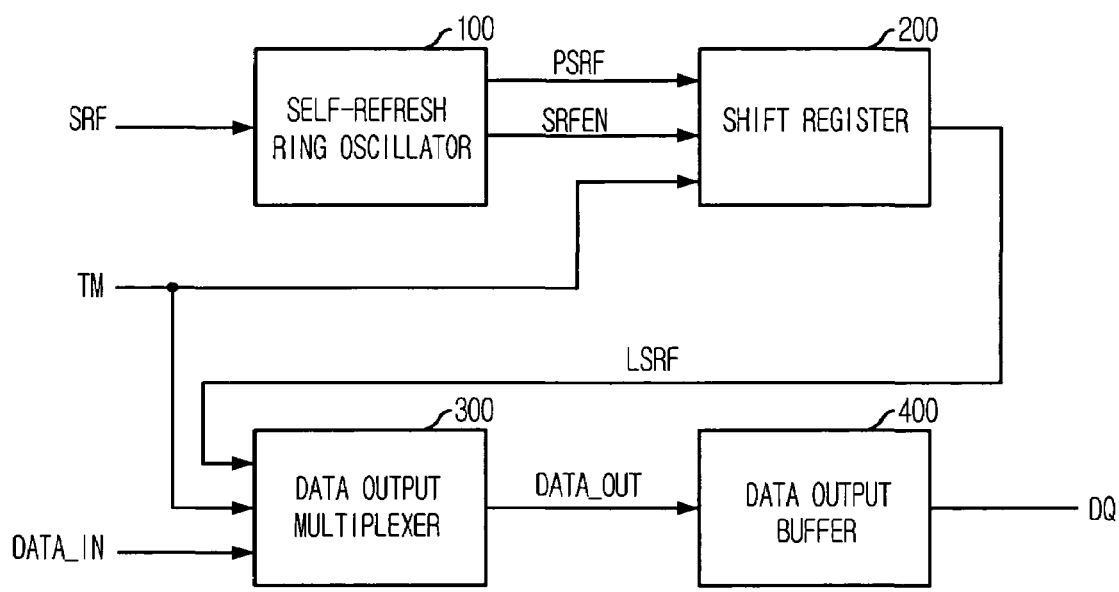
FIG. 1 is a block diagram setting forth a semiconductor memory device in accordance with an embodiment of the present invention.

FIG. 1 is a block diagram setting forth a semiconductor memory device in accordance with an embodiment of the present invention.

Referring to FIG. 1, the semiconductor memory device of the present invention includes a self-refresh ring oscillator 100, a shift register 200, a data output multiplexer, and a data output buffer 400. Herein, the self-refresh ring oscillator 100 generates a self-refresh enable signal SRFEN in response to a self-refresh signal SRF and generates a self-refresh oscillation pulse PSRF having a predetermined period, in which the self-refresh signal SRF is generated by receiving a self-refresh command SRFEN. A shift register 200 generates a self-refresh period level signal LSRF for maintaining a different level for a self-refresh period defined by the self-refresh enable signal SRFEN and the self-refresh period pulse PSRF, in response to a test mode signal TM. The data output multiplexer 300 selectively outputs a data signal DAtA_IN and the self-refresh period level signal LSRF in response to the test mode signal TM. The data output buffer 400 performs a buffering operation for the output signal DAtA_OUT of the data output multiplexer 300 so as to output the buffered signal through a data pin DQ.

That is, there are generally employed the self-refresh ring oscillator 100, the data output multiplexer 300 and the data output buffer 400 in the conventional semiconductor memory device, whereas the present invention additionally uses the shift register 200 in comparison with the conventional one.

Figure 2:
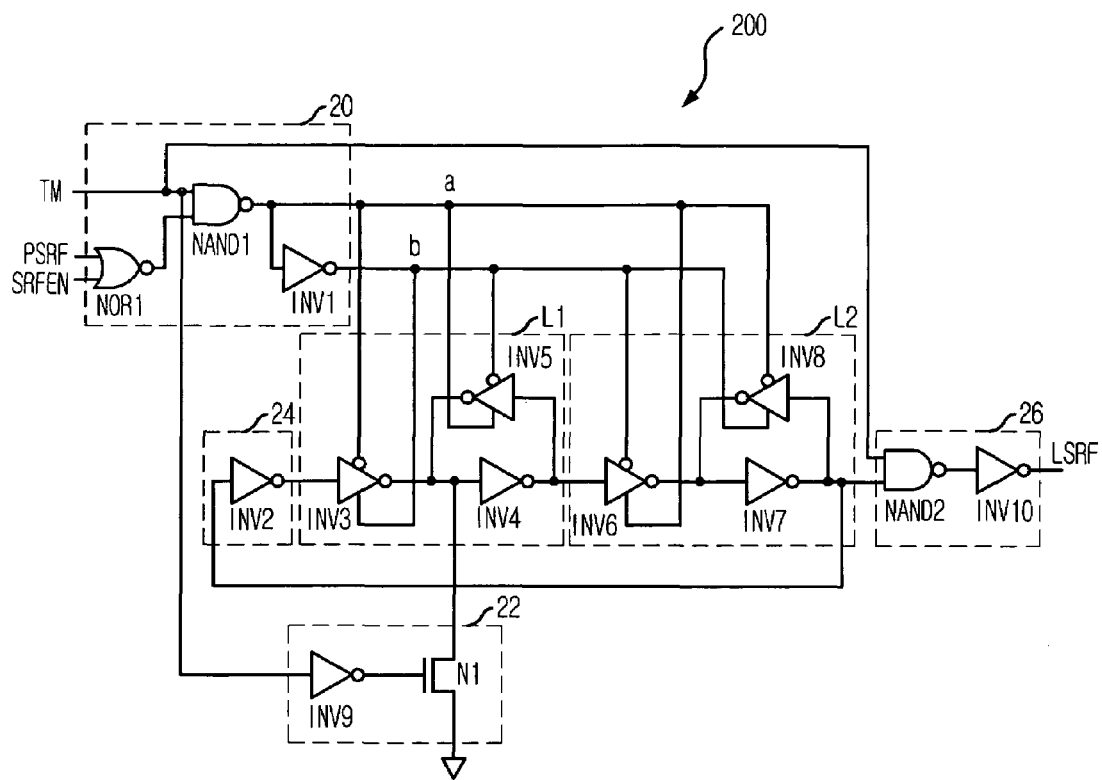
FIG. 2 is a circuit diagram of a shift register illustrated in FIG. 1.

FIG. 2 is a circuit diagram illustrating the shift register 200 of FIG. 1.

Referring to FIG. 2, the shift register 200 illustrated in the above, is provided with a pulsing information signal generator 20, a first and a second latch units L1 and L2, an initializer 22, an inversion unit 24 and an output unit 26. Herein, the pulsing information signal generator 20 generates pulsing information signals A and B of the self-refresh enable signal SRFEN and the self-refresh period pulse PSRF in response to the test mode signal TM. The first and the second latch units L1 and L2 perform a sequence latching operation in response to the pulsing information signals A and B. The initializer 22 initializes latch values of the first and the second latch units L1 and L2. The inversion unit 24 inverts polarities of the latch values of the first and the second latch units L1 and L2 at every self-refresh period. The output unit 26 enables/disables the outputted latch values of the second latch unit L2 in response to the test mode signal TM so as to output the self-refresh period level signal LSRF.

Herein, the pulsing information signal generator 20 is provided with a NOR gate NOR1 for performing a logic NOR operation to the self-refresh enable signal SRFEN and the self-refresh period pulse PSRF, a NAND gate NAND1 for performing a logic NAND operation to the output signal of the NOR gate NOR1 and the test mode signal TM so as to generate the pulsing information signal A, and an inverter INV1 for outputting the inverted signal B of the pulsing information signal A.

In addition, the first latch unit L1 is provided with an inverter INV3 controlled by the pulsing information signals A and B, an inverter INV4 for inverting the output signal of the inverter INV3, and an inverter INV5 controlled by the pulsing control signals A and B, in which the inverter INV5 forms a latch circuit in company with the inverter INV4. The second latch unit L2 is provided with an inverter INV6 controlled by the pulsing information signals A and B for inverting the output signal of the first latch unit L1, an inverter INV7 for inverting the output signal of the inverter INV6, and an inverter INV8 controlled by the pulsing information signals A and B forming a latch circuit in company with the inverter INV7. The first latch unit L1 is controlled by first polarities of the pulsing information signals A and B, whereas the second latch unit L2 is controlled by second polarities of the pulsing information signals A and B, wherein the first polarities are opposite to the second polarities.

Meanwhile, the initializer 22 is provided with an inverter INV9 receiving the test mode signal TM as an input signal, and an NMOS transistor N1 receiving the output signal of the inverter INV9 through a gate thereof, of which a source is connected to a ground voltage terminal VSS and a drain is connected to an input terminal of the inverter INV4, i.e., a latching node, in the first latch unit L1.

Furthermore, the inverter 24 is configured with an inverter. INV2 for inverting the output signal of the second latch unit L2 so as to transfer it to the inverter INV3 in the first latch unit L1.

The output unit 26 is provided with an NAND gate NAND2 for performing a logic NAND operation to the test mode signal TM and the output signal of the second latch unit L2, and an inverter INV10 for inverting the output signal of the NAND gate NAND2 so as to output the self-refresh period level signal LSRF.

Figure 3:
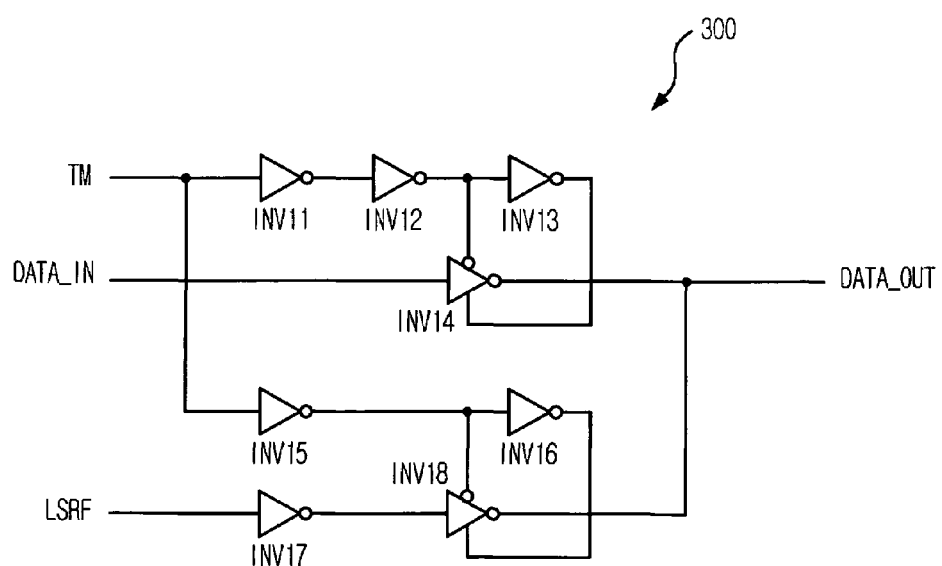
FIG. 3 is a circuit diagram of an output multiplexer illustrated in FIG. 1.

FIG. 3 is a circuit diagram representing the data output multiplexer 300 of FIG. 1.

Referring to FIG. 3, the data output multiplexer 300 is provided with an inverter INV11 for inverting the test mode signal TM, an inverter INV12 for inverting the output signal of the inverter INV11, an inverter INV13 for inverting the output signal of the inverter INV12, an inverter INV14 controlled by the output signals of the inverters INV12 and INV13 for inverting the data signal DATA_IN in the normal mode so as to output the inverted data signal DATA_OUT, an inverter INV15 for inverting the test mode signal TM, an inverter INV16 for inverting the output signal of the inverter INV15, an inverter INV17 for inverting the self-refresh period level signal LSRF, an inverter INV18 for inverting the output signal of the inverter INV17 in the test mode to output the inverted data signal DATA_OUT. Herein, the inverter INV18 is controlled by the output signals of the inverters INV15 and INV16, and the output signal of the inverter INV17 is an inverted signal of the self-refresh period level signal LSRF.

Figure 4:
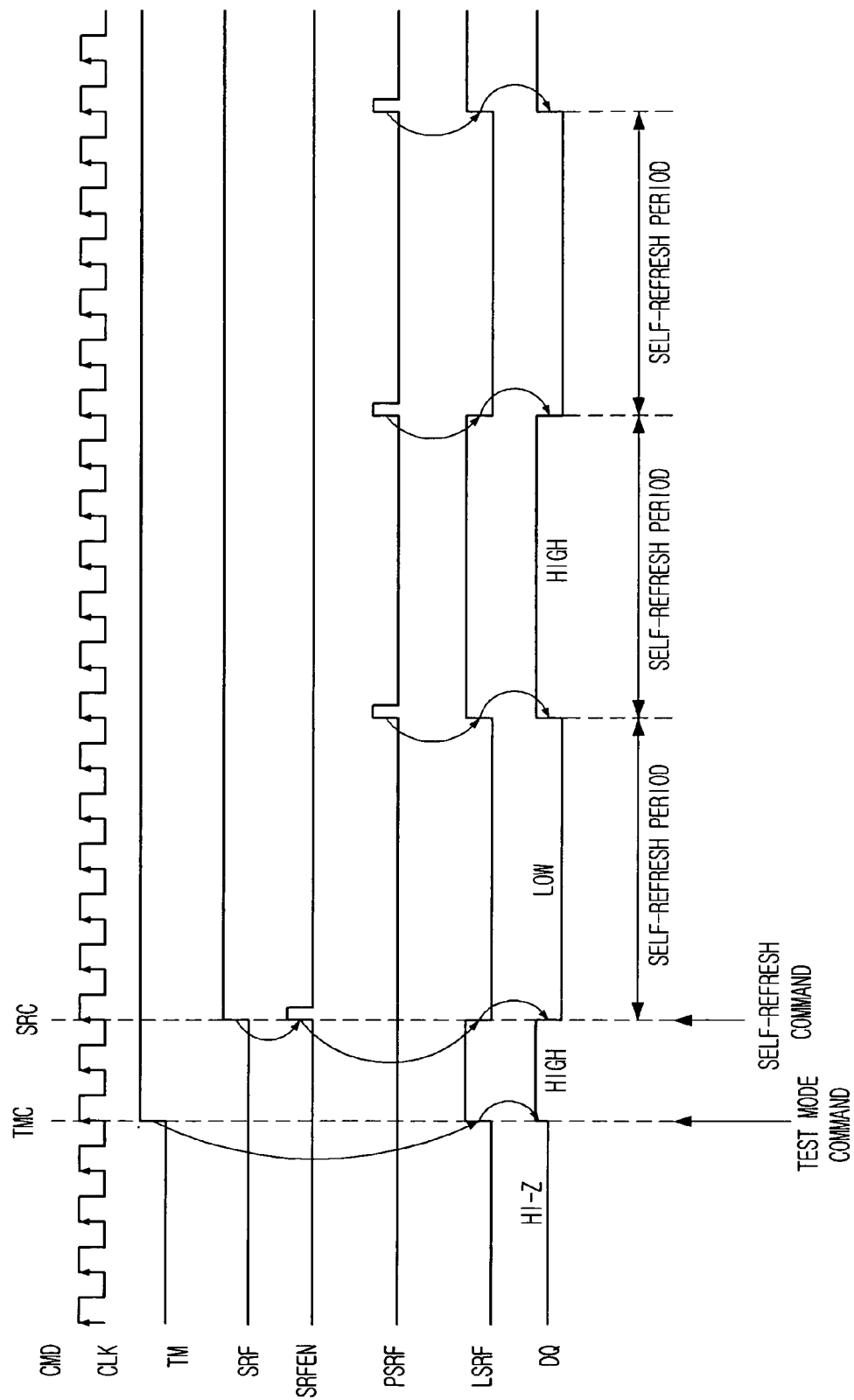
FIG. 4 is a timing diagram setting forth an operation of the semiconductor memory device in accordance with the embodiment of the present invention.

FIG. 4 is a timing diagram of the circuits in FIGS. 1 to 3. Hereinafter, an operation of the semiconductor memory device will described more fully in accordance with the embodiment of the present invention.

First, since the test mode signal TM is in logic low level in the normal mode, the self-refresh period level signal LSRF of the shift register 200 keeps logic low level while the data signal DATA_IN is selectively outputted at the data output multiplexer 300.

Meanwhile, when a test mode command TMC is applied, the test mode signal TM is activated to be logic high level. Therefore, the self-refresh period level signal LSRF of the shift register 200 becomes logic high level, and the data output multiplexer 300 cuts off the data signal DATA_IN and outputs the self-refresh period level signal LSRF. The reason the self-refresh period level signal LSRF is in logic high level in case of applying the test mode signal TMC is that the latch value of the first latch unit L1 is in a state of being initialized to low level already by the initializer 22 before applying the test mode command TMC.

In addition, if a self-refresh command SRC is applied to transit the self-refresh signal SRF to logic high level from logic low level, the self-refresh ring oscillator 100 is reset. Accordingly, the self-refresh enable signal SRFEN is pulsed to logic high level. In this case, the logic levels of the pulsing information signals A and B are varied at every one time so that the latch values of the first and the second latch units L1 and L2 are shifted. As a result, the self-refresh period level signal LSRF which has maintained its logic high level for a certain time is made to become logic low level and then, this is outputted to the data output pin DQ by way of the data output multiplexer 300 and the data output buffer 400.

Meanwhile, if the self-refresh ring oscillator 100 is operated at a pulsing point of the self-refresh enable signal SRFEN and reaches to a first period, the self-refresh period pulse PSRF is pulsed to logic high level and thus, a shift operation is performed at the shift register 200 to transit back the self-refresh period level signal LSRF to logic low level.

Thereafter, the self-refresh period pulse PSRF is pulsed to logic high level at every fixed period, and the shift operation is performed at the shift register 200 to periodically transit the logic level of the self-refresh period level signal LSRF.

As described above, in accordance with the present invention, since the signal of which the logic level is transmitted at every self refresh period in the test mode for testing the self-refresh period is outputted through the data output pin DQ, it is possible to easily analyze the self-refresh period using a tester or an oscilloscope in comparison with the case of outputting the conventional short pulse. As a result, the self-refresh period can be accurately measured and is fed back to fabrication processes of semiconductor chips, to thereby contribute to enhance chip quality.

The present application contains subject matter related to the Korean patent application No. KR 2005-0058406, filed in the Korean Patent Office on Jun. 30, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
   an oscillation means for generating a self-refresh enable signal and a self-refresh period pulse having a predetermined period in response to a self-refresh signal;
   a shift register for generating a self-refresh period level signal maintaining a different level at every self-refresh period defined by the self-refresh enable signal and the self-refresh period pulse, in response to a test mode signal;
   a multiplexing means for selectively outputting a data signal and the self-refresh period level signal in response to the test mode signal; and
   an output buffer for buffering the output signal of the multiplexing means to output the buffered signal.

2. The semiconductor memory device of claim 1, wherein the oscillation means includes a ring oscillator.

3. The semiconductor memory device of claim 2, wherein the shift register includes:
   a pulsing information signal generator for generating the self-refresh enable signal and a pulsing information signal of the self-refresh period pulse;
   a first and a second latch units for performing a sequential latch operation in response to the pulsing information signal;
   an initializer for initializing latch values of the first and the second latch units;
   an inversion unit for inverting polarities of the latch values of the first and the second latch units at every self-refresh period; and
   an output unit for enabling/disabling the outputted latch value of the second latch unit in response to the test mode signal to output the self-refresh period level signal.

4. The semiconductor memory device of claim 3, wherein the pulsing information signal generator includes:
   a NOR gate for performing a logic NOR operation to the self-refresh enable signal and the self-refresh period pulse;
   a first NAND gate for performing a logic NAND operation to the output signal of the NOR gate and the test mode signal to generate the pulsing information signal; and
   a first inverter for inverting the pulsing information signal.

5. The semiconductor memory device of claim 4, wherein fist latch unit includes:
   a second inverter controlled by the pulsing information signal and the inverted signal of the pulsing information signal;
   a third inverter for inverting the output signal of the second inverter; and
   a fourth inverter controlled by the pulsing information signal and the inverted signal of the pulsing information signal, forming a latch in company with the third inverter.

6. The semiconductor memory device of claim 5, wherein the second latch unit includes:
   a fifth inverter controlled by the pulsing information signal and the inverted signal of the pulsing information signal, for inverting the output signal of the first latch unit;
   a sixth inverter for inverting the output signal of the fifth inverter; and
   a seventh inverter controlled by the pulsing information signal and the inverted signal of the pulsing information signal, forming a latch in company with the sixth inverter,
   wherein the first latch unit is controlled by a first polarity of the pulsing information signal, whereas the second latch unit is controlled by a second polarity of the pulsing information signal, the first polarity being opposite to the second polarity.

7. The semiconductor memory device of claim 6, wherein the initializer includes:
   an eighth inverter for inverting the test mode signal; and
   an NMOS transistor receiving the output signal of the eighth inverter through a gate thereof, of which a source and a drain are connected to a ground voltage terminal and an input terminal of the third inverter in the first latch unit, respectively.

8. The semiconductor memory device of claim 7, wherein the inversion unit includes a ninth inverter for inverting the output signal of the second latch unit so as to transfer the inverted signal to the second inverter in the first latch unit.

9. The semiconductor memory device of claim 8, wherein the output unit includes:
   a second NAND gate for performing a logic NAND operation to the test mode signal and the output signal of the second latch unit; and
   a tenth inverter for inverting the output signal of the second NAND gate to output the self-refresh period level signal.

10. The semiconductor memory device of claim 3, wherein the multiplexing means includes:
    a first inverter for inverting the test mode signal;
    a second inverter for inverting the output signal of the first inverter;
    a third inverter for inverting the output signal of the second inverter;
    a fourth inverter controlled by the output signals of the second inverter and the third inverter, for inverting a data signal in a normal mode to output the inverted data signal;
    a fifth inverter for inverting the test mode signal;
    a sixth inverter for inverting the output signal of the fifth inverter;
    a seventh inverter for inverting the self-refresh period level signal; and
    an eighth inverter controlled by the output signals of the fifth and the sixth inverters, for inverting the output signal of the seventh inverter in a test mode to output the inverted signal as an output.

* * * * *

UNITED STATES PATENT AND TRADEMARK OFFICE
CERTIFICATE OF CORRECTION

PATENT NO. : 7,266,033 B2
APPLICATION NO. : 11/323359
DATED : September 4, 2007
INVENTOR(S) : Shim It is certified that error appears in the above-identified patent and that said Letters Patent is hereby corrected as shown below:

On the title page, in Item [56], under U.S. Patent Documents, line 3, please delete "1998" and insert -- 1996 --.

On the title page, in Item [56], under U.S. Patent Documents, line 6, please delete "2003" and insert -- 2005 --.

Signed and Sealed this

Twenty-ninth Day of April, 2008

JON W. DUDAS
*Director of the United States Patent and Trademark Office*